United States Patent
Ono (10) Patent No.: US 11,757,415 B2
(45) Date of Patent: *Sep. 12, 2023

(54) HIGH FREQUENCY AMPLIFIER CIRCUIT AND COMMUNICATION DEVICE

(71) Applicant: Murata Manufacturing Co., Ltd., Kyoto (JP)

(72) Inventor: Atsushi Ono, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/663,726

(22) Filed: May 17, 2022

(65) Prior Publication Data

US 2022/0278654 A1 Sep. 1, 2022

Related U.S. Application Data

(63) Continuation of application No. 17/032,986, filed on Sep. 25, 2020, now Pat. No. 11,362,626, which is a (Continued)

(30) Foreign Application Priority Data

Jun. 19, 2018 (JP) .................................. 2018-116342

(51) Int. Cl.
*H03F 1/42* (2006.01)
*H04B 1/40* (2015.01)
(Continued)

(52) U.S. Cl.
CPC ............... *H03F 1/42* (2013.01); *H03F 3/245* (2013.01); *H04B 1/40* (2013.01);
(Continued)

(58) Field of Classification Search
None
See application file for complete search history.

(56) References Cited

U.S. PATENT DOCUMENTS 7,260,369 B2 * 8/2007 Feher ....................... H04N 5/40
342/450
7,676,244 B2 3/2010 Park et al.
(Continued)

FOREIGN PATENT DOCUMENTS

| JP | 2004-320446 A | 11/2004 |
| JP | 2016-042699 A | 3/2016 |

OTHER PUBLICATIONS

International Search Report for International Application No. PCT/JP2019/023392 dated Aug. 27, 2019.
(Continued)

*Primary Examiner* — Pablo N Tran
(74) *Attorney, Agent, or Firm* — Pearne & Gordon LLP (57) ABSTRACT

A high frequency amplifier circuit includes an input terminal and an output terminal, transmission power amplifiers that amplify a high frequency signal in first and second frequency bands, each of which is a part of a communication band, at equal to or higher than a prescribed amplification factor, respectively, switches that exclusively switch connection between the input terminal, the transmission power amplifier, and the output terminal, and connection between the input terminal, the transmission power amplifier, and the output terminal, and a transmission filter that is connected between the output terminal and the switch and has a communication band as a pass band, the first frequency band including a frequency band other than the second frequency band, the second frequency band including a frequency band other than the first frequency band.

2 Claims, 4 Drawing Sheets

Related U.S. Application Data continuation of application No. PCT/JP2019/023392, filed on Jun. 13, 2019.

(51) Int. Cl.
*H03F 3/24* (2006.01)
*H04B 1/16* (2006.01)

(52) U.S. Cl.
CPC .. *H03F 2200/165* (2013.01); *H03F 2200/171* (2013.01); *H03F 2200/294* (2013.01); *H03F 2200/36* (2013.01); *H03F 2200/451* (2013.01)

(56) References Cited

U.S. PATENT DOCUMENTS

| | | |
|---|---|---|
| 10,200,077 B2 | 2/2019 | Liu et al. |
| 10,355,850 B2 | 7/2019 | Yoshimi et al. |
| 2003/0193923 A1 | 10/2003 | Abdelgany et al. |
| 2003/0203743 A1 | 10/2003 | Sugar et al. |
| 2007/0042802 A1* | 2/2007 | Park ................ H04B 1/006 455/552.1 |
| 2012/0202561 A1* | 8/2012 | Robinett ............ H04B 1/006 455/552.1 |
| 2013/0244722 A1 | 9/2013 | Rousu et al. |
| 2016/0190995 A1* | 6/2016 | Penticoff ............. H03F 3/213 330/295 |
| 2016/0211820 A1 | 7/2016 | Bagger et al. |
| 2017/0149479 A1 | 5/2017 | Kim et al. |

OTHER PUBLICATIONS

Written Opinion for International Application No. PCT/JP2019/023392 dated Aug. 27, 2019.

* cited by examiner

HIGH FREQUENCY AMPLIFIER CIRCUIT AND COMMUNICATION DEVICE

This is a continuation of U.S. patent application Ser. No. 17/032,986 filed on Sep. 25, 2020, which is a continuation of International Application No. PCT/JP2019/023392 filed on Jun. 13, 2019, which claims priority from Japanese Patent Application No. 2018-116342 filed on Jun. 19, 2018. The contents of these applications are incorporated herein by reference in their entireties.

BACKGROUND

The present disclosure relates to a high frequency amplifier circuit and a communication device.

In recent years, it has been desired to amplify high frequency signals of a plurality of communication bands with high gain and low noise in a high frequency amplifier circuit for a mobile communication device corresponding to multi-band/multi-mode.

Japanese Unexamined Patent Application Publication No. 2004-320446 (FIG. 2) discloses a multiband communication device including an antenna duplexer, a first power amplifier and a second power amplifier, and a first low-noise amplifier and a second low-noise amplifier. In the above-described multiband communication device, in each of wireless communication schemes of UMTS, PCS, and DCS, the first power amplifier and the first low-noise amplifier are selected, and in each of wireless communication schemes of GSM (registered trademark) 850 and GSM (registered trademark) 900, the second power amplifier and the second low-noise amplifier are selected. Accordingly, the multiband communication device can amplify the high frequency signals in the plurality of communication bands and the plurality of communication systems with high gain and low noise.

In the communication standard that is put into practical use in the future, the communication band copes with a high frequency and a wide band. For example, in a case of n77 allocated as a communication band in 5G (NR) of the 3GPP (Third Generation Partnership Project) standard, a frequency band width of the communication band is 900 MHz, and has a significantly wide band compared to existing communication bands of LTE (Long Term Evolution).

On the other hand, the high frequency amplifier used in the mobile communication device has a limit in a dynamic range (frequency band) having good amplification characteristics. For this reason, as in the multiband communication device described in Japanese Unexamined Patent Application Publication No. 2004-320446, when attempting to cope with wide communication bands, such as n77 by one power amplifier or one low-noise amplifier for each communication band, it is difficult to ensure good amplification characteristics in the entire communication band, and the amplification characteristics deteriorate.

BRIEF SUMMARY

The present disclosure provides a high frequency amplifier circuit and a communication device capable of ensuring good amplification characteristics in a wide communication band.

A high frequency amplifier circuit according to an aspect of the present disclosure includes: an input terminal and an output terminal; a first amplifier disposed between the input terminal and the output terminal and configured to amplify a high frequency signal in a first frequency band, which is a part of a first communication band, at equal to or higher than a prescribed amplification factor; a second amplifier disposed between the input terminal and the output terminal and configured to amplify a high frequency signal in a second frequency band, which is a part of the first communication band, at equal to or higher than a prescribed amplification factor; a switch circuit disposed between the input terminal and the output terminal and configured to exclusively switch between a connection between the input terminal, the first amplifier, and the output terminal and a connection between the input terminal, the second amplifier, and the output terminal; and a filter connected between the input terminal or the output terminal and the switch circuit, and having the first communication band as a pass band, in which the first frequency band includes a frequency band other than the second frequency band, and the second frequency band includes a frequency band other than the first frequency band.

Other features, elements, characteristics and advantages of the present disclosure will become more apparent from the following detailed description of embodiments of the present disclosure with reference to the attached drawings.

DETAILED DESCRIPTION

Hereinafter, an embodiment of the present disclosure will be described in detail with reference to the accompanying drawings. Note that examples and modifications described hereafter each illustrates a comprehensive or specific example. The numerical values, shapes, materials, constituent elements, arrangements and connection forms of the constituent elements, and the like described in the following examples and modifications are merely examples, and are not intended to limit the present disclosure. Among the constituent elements in the following examples and modifications, constituent elements not described in the independent claims are described as arbitrary constituent elements. In addition, the size or ratio of the size of the constituent elements illustrated in the drawings is not necessarily strict.

EMBODIMENTS 1.1 Configuration of Communication Device

Figure 1:
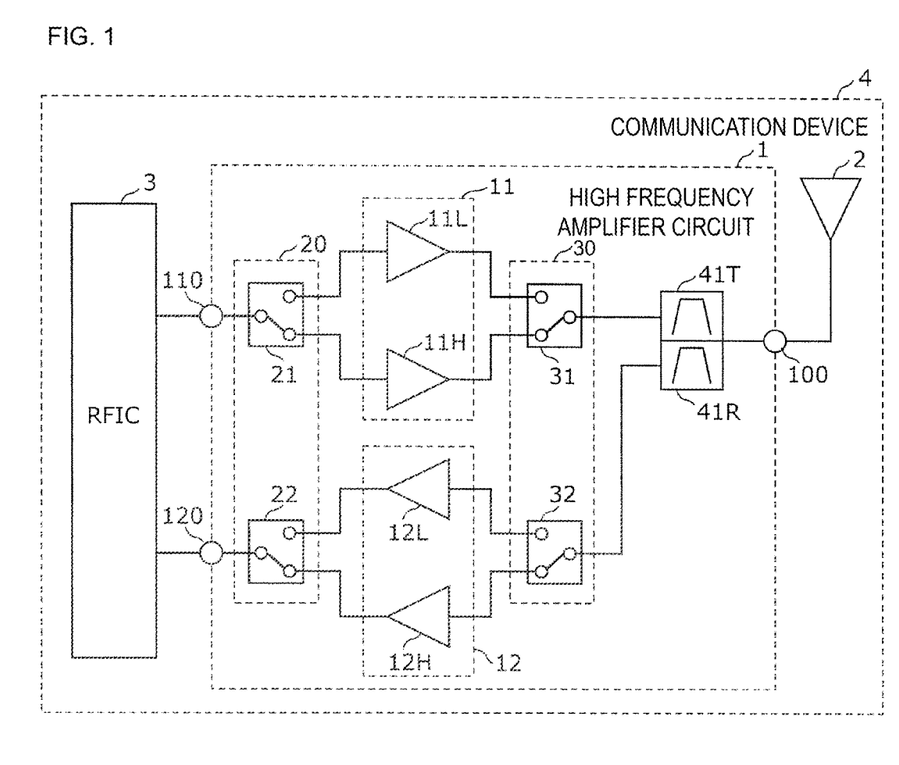
FIG. 1 is a circuit configuration diagram of a communication device according to an embodiment.

FIG. 1 is a circuit configuration diagram of a communication device 4 according to an embodiment. As illustrated in the figure, the communication device 4 includes an antenna element 2, a high frequency amplifier circuit 1, and an RF signal processing circuit (RFIC) 3.

The RFIC 3 is an RF signal processing circuit that processes a high frequency signal transmitted and received by the antenna element 2. Specifically, the RFIC 3 performs signal processing on a high frequency reception signal input via a reception path of the high frequency amplifier circuit 1 by down-conversion or the like, and outputs a reception signal generated by the signal processing to a baseband signal processing circuit (not illustrated) or the like. In addition, the RFIC 3 performs signal processing on a transmission signal input from the baseband signal processing circuit or the like by up-conversion or the like, and outputs a high frequency transmission signal generated by the signal processing to a transmission path of the high frequency amplifier circuit 1.

The RFIC 3 also has a function as a control unit that controls a connection state of switch circuits 20 and 30 included in the high frequency amplifier circuit 1 based on a channel of a communication band to be used. Specifically, the RFIC 3 switches a connection state of the switch circuits 20 and 30 included in the high frequency amplifier circuit 1 by a control signal (not illustrated). Note that the control unit may be provided outside the RFIC 3, and may be provided in, for example, the high frequency amplifier circuit 1 or the baseband signal processing circuit.

The antenna element 2 is connected to a common terminal 100 of the high frequency amplifier circuit 1, radiates a high frequency signal output from the high frequency amplifier circuit 1, and receives a high frequency signal from the outside to output the high frequency signal to the high frequency amplifier circuit 1.

Note that in the communication device 4 according to the present embodiment, the antenna element 2 is an optional constituent element.

Next, a detailed configuration of the high frequency amplifier circuit 1 will be described.

As illustrated in FIG. 1, the high frequency amplifier circuit 1 includes the common terminal 100, a transmission input terminal 110 and a reception output terminal 120, transmission power amplifiers 11L and 11H, reception low-noise amplifiers 12L and 12H, switches 21, 22, 31, and 32, a transmission filter 41T, and a reception filter 41R.

The common terminal 100 is connected to the antenna element 2. The transmission input terminal 110 is connected to the RFIC 3. The high frequency transmission signal generated by the RFIC 3 is input to a transmission path of the high frequency amplifier circuit 1 via the transmission input terminal 110. The reception output terminal 120 is connected to the RFIC 3. The high frequency reception signal that has propagated through a reception path of the high frequency amplifier circuit 1 is output to the RFIC 3 via the reception output terminal 120. Note that the transmission input terminal corresponds to an input terminal, and the common terminal 100 corresponds to an output terminal, in the transmission path configured by the switches 21 and 31, the transmission power amplifiers 11L and 11H, and the transmission filter 41T. Further, the common terminal 100 corresponds to an input terminal, and the reception output terminal 120 corresponds to an output terminal, in the reception path configured by the switches 22 and 32, the reception low-noise amplifiers 12L and 12H, and the reception filter 41R.

The transmission power amplifier 11L is a first amplifier disposed between the transmission input terminal 110 and the common terminal 100, and more specifically, is connected to the switches 21 and 31. The transmission power amplifier 11L amplifies the high frequency signal in a first frequency band, which is a part of a transmission band of a single communication band A (first communication band), at equal to or higher than a prescribed amplification factor (or prescribed gain).

The transmission power amplifier 11H is a second amplifier disposed between the transmission input terminal 110 and the common terminal 100, and more specifically, is connected to the switches 21 and 31. The transmission power amplifier 11H amplifies the high frequency signal in a second frequency band, which is a part of the transmission band of the single communication band A (first communication band), at equal to or higher than a prescribed amplification factor (or a prescribed gain). The transmission power amplifier 11L and the transmission power amplifier 11H are connected in parallel between the switch 21 and the switch 31.

Note that the prescribed amplification factor (or the prescribed gain) in the transmission power amplifier is, for example, an amplification factor (or gain) suitable for performing normal communication between a base station and the mobile communication device having the high frequency amplifier circuit, and is an amplification factor (or gain) required for intensity of the high frequency signal radiated from the antenna element 2 to satisfy a predetermined required specification.

Further, the prescribed amplification factor (or the prescribed gain) in the transmission power amplifier is, for example, an amplification factor (or gain) suitable for performing normal communication between the base station and the mobile communication device having the high frequency amplifier circuit, and may be an amplification factor (or gain) that has been reduced by about 3 dB from a maximum amplification factor (or maximum gain) of the transmission power amplifier.

The transmission power amplifier 11L and the transmission power amplifier 11H configure a transmission power amplifier circuit 11.

Each of the transmission power amplifiers 11L and 11H is configured by, for example, a complementary metal oxide semiconductor (CMOS), or a field-effect transistor or a bipolar transistor using GaAs as a material. In a case where each of the transmission power amplifiers 11L and 11H is configured by a plurality of stages of amplification elements in cascading connection, it is possible to manufacture a transmission power amplifier at low cost by configuring an amplification element in a preceding stage that does not require power handling by using the CMOS. On the other hand, the amplification element in a subsequent stage in which a power level of the high frequency signal is high can have high quality amplification characteristics and noise characteristics by being configured by a GaAs-based material. Further, the amplification element in the preceding stage that does not require the power handling may be formed into one chip by the CMOS, together with the switches 21 and 31, and the above-described control unit. This makes it possible to reduce the size of the high frequency amplifier circuit 1.

Here, the above-described first frequency band includes a frequency band other than the above-described second frequency band, and the second frequency band includes a frequency band other than the first frequency band. That is, frequency characteristics of the amplification factor (or the gain) of the transmission power amplifier 11L and frequency characteristics of the amplification factor (or the gain) of the transmission power amplifier 11H are different from each other. Although the transmission power amplifier 11L amplifies signals in the first frequency band of the communication band A at equal to or higher than the above-described prescribed amplification factor (or the prescribed gain), signals in the entire transmission band of the communication band A cannot be amplified at equal to or higher than the above-described prescribed amplification factor (or the prescribed gain). Further, although the transmission power amplifier 11H amplifies signals in the second frequency band of the communication band A at equal to or higher than the above-described prescribed amplification factor (or the prescribed gain), signals in the entire transmission band of the communication band A cannot be amplified at equal to or higher than the above-described prescribed amplification factor (or the prescribed gain).

Note that the prescribed amplification factors (or the prescribed gains) of the transmission power amplifiers 11L and 11L are determined by the transmission power required for the mobile communication device on which the high frequency amplifier circuit 1 according to the present embodiment is mounted, however the above-described prescribed amplification factor (or the prescribed gain) in the transmission circuit is, for example, about 25 dB to 32 dB.

The switch 21 is disposed between the transmission input terminal 110 and the transmission power amplifiers 11L and 11H, and exclusively switches between connection between the transmission input terminal 110 and the transmission power amplifier 11L and connection between the transmission input terminal 110 and the transmission power amplifier 11H. The switch 31 is disposed between the transmission filter 41T and the transmission power amplifiers 11L and 11H, and exclusively switches between connection between the transmission filter 41T and the transmission power amplifier 11L and connection between the transmission filter 41T and the transmission power amplifier 11H. The switches 21 and 31 configure a switch circuit in a transmission system. In the above-described configuration, the switches 21 and 31 exclusively switch between the connection between the transmission input terminal 110, the transmission power amplifier 11L, and the common terminal 100, and the connection between the transmission input terminal 110, the transmission power amplifier 11H, and the common terminal 100.

The transmission filter 41T is a filter that is connected between the common terminal 100 and the switch 31 and has a transmission band of the communication band A as a pass band.

According to the above-described configuration, the high frequency amplifier circuit 1 includes: the transmission power amplifier 11L that is disposed between the transmission input terminal 110 and the common terminal 100 and amplifies the high frequency signal in the first frequency band, which is a part of the single communication band A, at equal to or higher than the prescribed amplification factor; the transmission power amplifier 11H that is disposed between the transmission input terminal 110 and the common terminal 100 and amplifies the high frequency signal in the second frequency band, which is a part of the communication band A, at equal to or higher than the prescribed amplification factor; switches 21 and 31 that are disposed between the transmission input terminal 110 and the common terminal 100 and exclusively switch between the connection between the transmission input terminal 110, the transmission power amplifier 11L and the common terminal 100, and the connection between the transmission input terminal 110, the transmission power amplifier 11H, and the common terminal 100; and the transmission filter 41T that is connected between the common terminal 100 and the switch 31 and has the communication band A as a pass band. Here, the first frequency band includes a frequency band other than the second frequency band, and the second frequency band includes a frequency band other than the first frequency band.

That is, in each of the transmission power amplifiers 11L and 11H, a dynamic range (a frequency band) having the prescribed amplification factor (or the prescribed gain) is smaller than the transmission band of the communication band A. However, it is possible to ensure good amplification characteristics in the entire transmission band of the communication band A as the transmission power amplifier circuit 11 by exclusively switching between the two transmission power amplifiers 11L and 11H having different frequency characteristics of the amplification factor (or the gain) by the switches 21 and 31 within the single communication band.

Note that it is desirable that the first frequency band in which the transmission power amplifier 11L amplifies signals at equal to or higher than the prescribed amplification factor (or the prescribed gain), and the second frequency band in which the transmission power amplifier 11H amplifies signals at equal to or higher than the prescribed amplification factor (or the prescribed gain) partially overlap each other. Accordingly, it is possible to suppress fluctuation of the amplification characteristic in a boundary band between the first frequency band and the second frequency band in the transmission band of the communication band A.

Further, it is desirable that gain characteristics of the transmission power amplifier 11L in the first frequency band and gain characteristics of the transmission power amplifier 11H in the second frequency band be substantially equal to each other. The term substantially equal means that the difference between the gain characteristics of the transmission power amplifier 11L in the first frequency band and gain characteristics of the transmission power amplifier 11H in the second frequency band is equal to 0 or less than 0.1. Thereby, it is possible to suppress the fluctuation of the amplification characteristic in the first frequency band and the second frequency band in the transmission band of the communication band A.

The reception low-noise amplifier 12L is the first amplifier disposed between the common terminal 100 and the reception output terminal 120, and more specifically, is connected to the switches 22 and 32. The reception low-noise amplifier 12L amplifies a high frequency signal in a third frequency band, which is a part of a reception band of the single communication band A (first communication band), at equal to or higher than a prescribed amplification factor (or a prescribed gain).

The reception low-noise amplifier 12H is the second amplifier disposed between the common terminal 100 and the reception output terminal 120, and more specifically, is connected to the switches 22 and 32. The reception low-noise amplifier 12H amplifies a high frequency signal in a fourth frequency band, which is a part of the reception band of the single communication band A (first communication band), at equal to or higher than a prescribed amplification factor (or a prescribed gain). The reception low-noise amplifier 12L and the reception low-noise amplifier 12H are connected in parallel between the switch 22 and the switch 32.

The reception low-noise amplifier 12L and the reception low-noise amplifier 12H configure a reception low-noise amplifier circuit 12.

Each of the reception low-noise amplifiers 12L and 12H is configured by, for example, a field-effect transistor or a bipolar transistor that is made of a material, such as CMOS or GaAs. In a case where each of the reception low-noise amplifiers 12L and 12H is configured by a plurality of stages of amplification elements in cascading connection, it is possible to manufacture the reception low-noise amplifier at low cost by configuring the amplification element in a preceding stage that does not require power handling by using the CMOS. On the other hand, the amplification element in a subsequent stage in which the power level of the high frequency signal is high can have high quality amplification characteristics and noise characteristics by being configured by the GaAs-based material. Further, the amplification element in the preceding stage that does not need power handling may be formed into one chip by the CMOS, together with the switches 22 and 32, and the above-described control unit. This makes it possible to reduce the size of the high frequency amplifier circuit 1.

Here, the third frequency band includes a frequency band other than the fourth frequency band, and the fourth frequency band includes a frequency band other than the third frequency band. That is, the frequency characteristics of the amplification factor (or gain) of the reception low-noise amplifier 12L and the frequency characteristics of the amplification factor (or gain) of the reception low-noise amplifier 12H are different from each other. Although the reception low-noise amplifier 12L amplifies signals in the third frequency band of the communication band A at equal to or higher than the above-described prescribed amplification factor (or the prescribed gain), signals in the entire reception band of the communication band A cannot be amplified at equal to or higher than the above-described prescribed amplification factor (or the prescribed gain). Further, although the reception low-noise amplifier 12H amplifies signals in the fourth frequency band of the communication band A at equal to or higher than the above-described prescribed amplification factor (or the prescribed gain), signals in the entire reception band of the communication band A cannot be amplified by equal to or higher than the above-described prescribed amplification factor (or the prescribed gain).

Note that the prescribed amplification factors (or prescribed gains) of the reception low-noise amplifiers 12L and 12H are determined by the reception power required for the mobile communication device on which the high frequency amplifier circuit 1 according to the present embodiment is mounted, however, the above-described prescribed amplification factor (or the prescribed gain) in the reception circuit is, for example, about 25 dB to 32 dB.

The switch 22 is disposed between the reception output terminal 120 and the reception low-noise amplifiers 12L and 12H, and exclusively switches between a connection between the reception output terminal 120 and the reception low-noise amplifier 12L and a connection between the reception output terminal 120 and the reception low-noise amplifier 12H. The switch 32 is disposed between the reception filter 41R and the reception low-noise amplifiers 12L and 12H, and exclusively switches between connection between the reception filter 41R and the reception low-noise amplifier 12L and connection between the reception filter 41R and the reception low-noise amplifier 12H. The switches 22 and 32 configure a switch circuit in a reception system. In the above-described configuration, the switches 22 and 32 exclusively switch between the connection between the common terminal 100, the reception low-noise amplifier 12L, and the reception output terminal 120, and the connection between the common terminal 100, the reception low-noise amplifier 12H, and the reception output terminal 120.

Note that the switches 21, 22, 31, and 32 may operate in synchronization with one another in a manner such that in a case where the transmission input terminal 110, the transmission power amplifier 11L, and the common terminal 100 are connected, the common terminal 100, the reception low-noise amplifier 12L, and the reception output terminal 120 may be connected, and in a case where the transmission input terminal 110, the transmission power amplifier 11H, and the common terminal 100 are connected, the common terminal 100, the reception low-noise amplifier 12H, and the reception output terminal 120 may be connected.

Further, the switch circuit 20 configured by the switches 21 and 22, the switch circuit 30 configured by the switches 31 and 32, and the above-described control unit may be configured by one chip switch IC.

The reception filter 41R is a filter which is connected between the common terminal 100 and the switch 32 and has the reception band of the communication band A as a pass band.

According to the configuration of the above-described reception path, in each of the reception low-noise amplifiers 12L and 12H, a dynamic range (a frequency band) having the above-described prescribed amplification factor (or the prescribed gain) is smaller than the reception band of the communication band A. However, it is possible to ensure good amplification characteristics in the entire reception band of the communication band A as the reception low-noise amplifier circuit 12 by exclusively switching between the two reception low-noise amplifiers 12L and 12H having different frequency characteristics of the amplification factor (or the gain) by the switches 22 and 32.

Note that it is desirable that the third frequency band in which the reception low-noise amplifier 12L amplifies signals at equal to or higher than the prescribed amplification factor (or the prescribed gain), and the fourth frequency band in which the reception low-noise amplifier 12H amplifies signals at equal to or higher than the prescribed amplification factor (or the prescribed gain) partially overlap each other. Accordingly, it is possible to suppress fluctuation of the amplification characteristic in a boundary band between the third frequency band and the fourth frequency band in the reception band of the communication band A.

Further, it is desirable that gain characteristics of the reception low-noise amplifier 12L in the third frequency band and gain characteristics of the reception low-noise amplifier 12H in the fourth frequency band be substantially equal to each other. The term substantially equal means that the difference between the gain characteristics of the reception low-noise amplifier 12L in the third frequency band and the gain characteristics of the reception low-noise amplifier 12H in the fourth frequency band is equal to 0 or less than 0.1. Thereby, it is possible to suppress the fluctuation of the amplification characteristics in the third frequency band and the fourth frequency band in the reception band of the communication band A.

In addition, the high frequency amplifier circuit 1 according to the present embodiment has a configuration in which two amplifiers having different amplification characteristics are connected in parallel in both the transmission path and the reception path, but the high frequency amplifier circuit according to the present disclosure may have a configuration in which two amplifiers having different amplification characteristics are connected in parallel in at least one of the transmission path and the reception path.

Further, at least one of the switches 21 and 31 may be disposed in the transmission path, and at least one of the switches 22 and 32 may be disposed in the reception path.

Figure 2A:
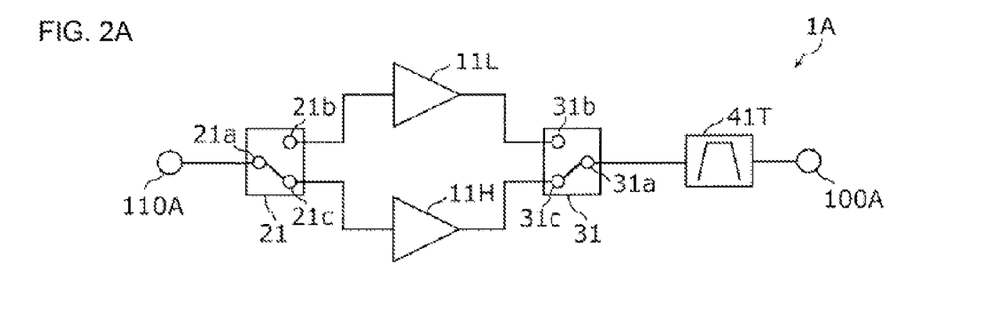
FIG. 2A is a circuit configuration diagram of a high frequency amplifier circuit according to Modification 1 of the embodiment.

1.2 Configuration of High Frequency Amplifier Circuit of Transmission System FIG. 2A is a circuit configuration diagram of a high frequency amplifier circuit 1A according to Modification 1 of the embodiment. The high frequency amplifier circuit 1A illustrated in the figure includes an input terminal 110A and an output terminal 100A, the transmission power amplifiers 11L and 11H, the switches 21 and 31, and the transmission filter 41T. The high frequency amplifier circuit 1A according to the present modification differs from the high frequency amplifier circuit 1 according to the embodiment in that only a transmission circuit is provided. Hereinafter, for the high frequency amplifier circuit 1A according to the present modification, a description on the same points as those of the high frequency amplifier circuit 1 according to the embodiment will be omitted, and a description will be focused on different points.

Figure 2B:
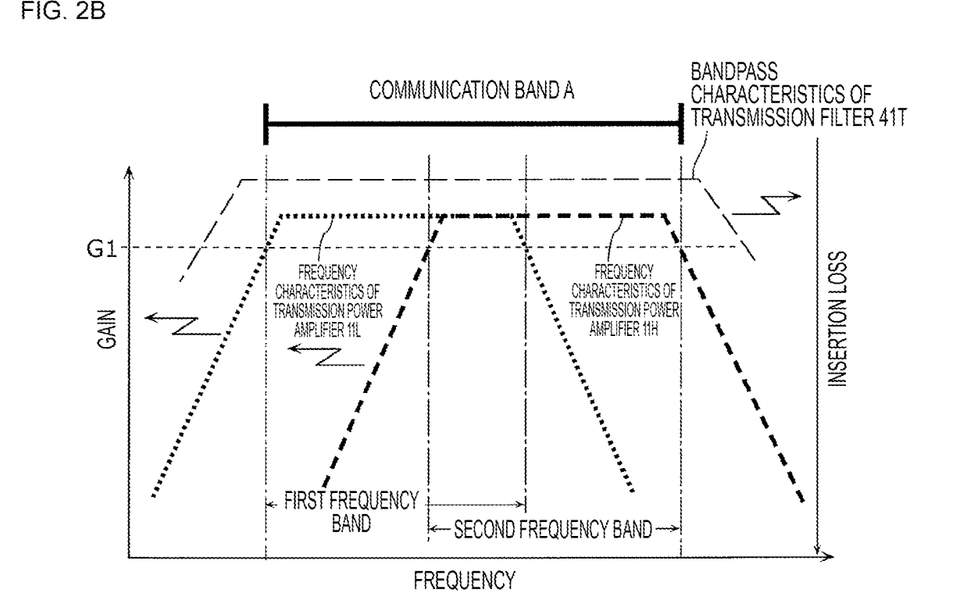
FIG. 2B is a diagram illustrating a relationship between a communication band, gain characteristics of an amplifier, and bandpass characteristics of a filter of the high frequency amplifier circuit according to Modification 1 of the embodiment.

FIG. 2B is a diagram illustrating a relationship between the communication band, the gain characteristics of the amplifier, and the bandpass characteristics of the transmission filter of the high frequency amplifier circuit 1A according to Modification 1 of the embodiment.

The transmission power amplifier 11L is the first amplifier disposed between the input terminal 110A and the output terminal 100A, and is a first transmission power amplifier that preferentially amplifies a high frequency signal in the first frequency band among the high frequency signals input from the input terminal 110A. More specifically, as illustrated in FIG. 2B, the transmission power amplifier 11L amplifies the high frequency signal in the first frequency band, which is a part of the single communication band A (first communication band), at equal to or higher than a prescribed amplification factor (or a prescribed gain). Note that, in the high frequency amplifier circuit 1A according to the present modification, equal to or more than G1 (dB) is required as the gain of the transmission power amplifiers 11L and 11H in a manner such that the high frequency signal output from the output terminal 100A becomes equal to or more than a predetermined power value. That is, in the frequency characteristics of the gain of the transmission power amplifier 11L, the gain is equal to or more than G1 in the first frequency band that is the low frequency side of the communication band A, but the gain is smaller than G1 in the band of the communication band A on the high frequency side than the first frequency band.

The transmission power amplifier 11H is the second amplifier disposed between the input terminal 110A and the output terminal 100A, and is a second transmission power amplifier that preferentially amplifies a high frequency signal in the second frequency band among the high frequency signals input from the input terminal 110A. More specifically, as illustrated in FIG. 2B, the transmission power amplifier 11H amplifies a high frequency signal in the second frequency band, which is a part of a single communication band A (first communication band), at equal to or higher than a prescribed amplification factor (or a prescribed gain). That is, in the frequency characteristics of the gain of the transmission power amplifier 11H, the gain is equal to or more than G1 in the second frequency band that is the high frequency side of the communication band A, but the gain is smaller than G1 in the band of the communication band A on the low frequency side than the second frequency band.

The switch 21 is a first switch having a common terminal 21a (first common terminal) and selection terminals 21b (first selection terminal) and 21c (second selection terminal). The common terminal 21a is connected to the input terminal 110A, the selection terminal 21b is connected to an input end of the transmission power amplifier 11L, and the selection terminal 21c is connected to an input end of the transmission power amplifier 11H.

The switch 31 is a second switch having a common terminal 31a (second common terminal) and selection terminals 31b (third selection terminal) and 31c (fourth selection terminal). The common terminal 31a is connected to an input end of the transmission filter 41T, the selection terminal 31b is connected to an output end of the transmission power amplifier 11L, and the selection terminal 31c is connected to an output end of the transmission power amplifier 11H.

In the above-described configuration, the switches 21 and 31 exclusively switch between connection between the input terminal 110A, the transmission power amplifier 11L, and the output terminal 100A and connection between the input terminal 110A, the transmission power amplifier 11H, and the output terminal 100A.

Note that a switch circuit configured by the switches 21 and 31 and a control unit that controls the connection state of the switch circuit may be configured by one chip switch IC.

The transmission filter 41T is a filter having an output end connected to the output terminal 100A, in which the entire area of the single communication band A is used as a pass band. The transmission filter 41T is always connected to either of the transmission power amplifiers 11L or 11H regardless of the switching of the switches 21 and 31.

The "communication band" according to the present embodiment is defined as a unit in which radio waves used for wireless communication by a mobile communication device, such as a cellular phone are classified according to their frequency and are defined by a country (Ministry of Internal Affairs and Communications) or the like. A single "communication band" normally has a continuous frequency band, and each existing communication band of LTE up to 3 GHz has been allocated to a frequency band having a band width that can be used without necessarily requiring switching or changing of hardware and software for wireless communication.

However, in the communication standard to be put into practical use in the future, the allocated communication band has a higher frequency and a wider band. For example, in a case of n77 allocated as a single communication band in 5G (NR) of the 3GPP standard, the frequency band width of the communication band is 900 MHz, which is significantly wide compared to the existing bands of LTE. On the other hand, the high frequency amplifier used in the mobile communication device has a limit in a dynamic range (frequency band) having good amplification characteristics, and for example, it is difficult to set the pass band of one amplifier (the frequency band that is equal to or higher than a prescribed amplification factor (or a prescribed gain)) to be equal to or higher than 900 MHz. In addition, when attempting to cope with the wide communication band as described above by using one transmission power amplifier, it is difficult to ensure good amplification characteristics in the entire area of the communication band.

On the other hand, according to the high frequency amplifier circuit 1A according to the present modification, in each of the transmission power amplifiers 11L and 11H, the dynamic range having the above-described prescribed amplification factor (or the prescribed gain) is smaller than the frequency band of the communication band A. However, by exclusively switching between the two transmission power amplifiers 11L and 11H having different frequency characteristics of the gain by the switches 21 and 31, it is possible to ensure good amplification characteristics in the entire area of the wide communication band A.

Note that the high frequency amplifier circuit 1A according to the present modification is applicable as a front-end circuit that uses a 5G (NR) communication band of the 3GPP standard, and as the above-described communication band A, for example, at least one of n77 (transmission/reception band: 3300-4200 MHz), n78 (transmission/reception band: 3300-3800 MHz), and n79 (transmission/reception band: 4400-5000 MHz) may be used.

The communication bands exemplified described above each has a center frequency which is equal to or more than 3 GHz and are higher in frequency than the existing bands of LTE, therefore, even when having a fractional band width equivalent to that of the existing bands of LTE, the frequency band width is increased. From this viewpoint, the significance of applying the high frequency amplifier circuit 1A according to the present modification in which the two transmission power amplifiers having different frequency characteristics of the gain are arranged in parallel to cover the entire area of the communication band to the communication band having the center frequency which is equal to or higher than 3 GHz is large.

Note that the communication bands (n77, n78, and n79) of 5G (NR) of the above-described 3GPP standard have a plurality of communication channels. The communication channel is a frequency band in which one user can use in a single communication. In 3GPP standard 5G (NR) communication bands (n77, n78, and n79), the band width of one communication channel is much large compared to the band width of the communications channel in the existing bands of LTE, and is up to about 100 MHz (hereinafter, defined as a maximum usage band width of the channel). For example, the communication band n77 has approximately 9 communication channels.

Figure 3A:
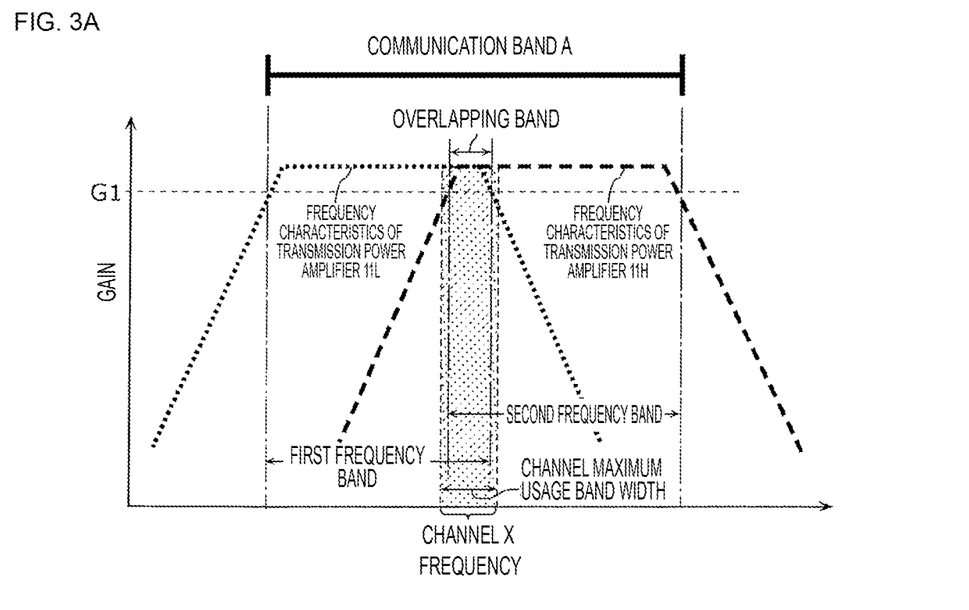
FIG. 3A is a diagram illustrating a relationship in which an overlapping band of frequency characteristics of gain is smaller than a maximum usage band width of a channel.

FIG. 3A is a diagram illustrating a relationship in which an overlapping band of the frequency characteristics of the gain is smaller than the maximum usage band width of the channel.

In the figure, in the transmission power amplifier 11L, the first frequency band in which the gain is equal to or more than G1 is positioned on the low frequency side of the communication band A, and in the transmission power amplifier 11H, the second frequency band in which the gain is equal to or more than G1 is positioned on the high frequency side of the communication band A. Here, the band width (overlapping band width) of the band in which the first frequency band and the second frequency band overlap each other is smaller than the maximum usage band width of the channel. In this case, as illustrated in FIG. 3A, a channel x of the communication band A includes the overlapping band width. Then, in a case where the transmission is performed using the channel x, when the transmission power amplifier 11L is selected, the gain is degraded in a high frequency side region of the channel x, and when the transmission power amplifier 11H is selected, the gain is degraded in a low-frequency side region of the channel x. That is, in a case where the transmission is performed using the channel x, it is not possible to ensure good amplification characteristics even when any one of the transmission power amplifiers is selected.

Figure 3B:
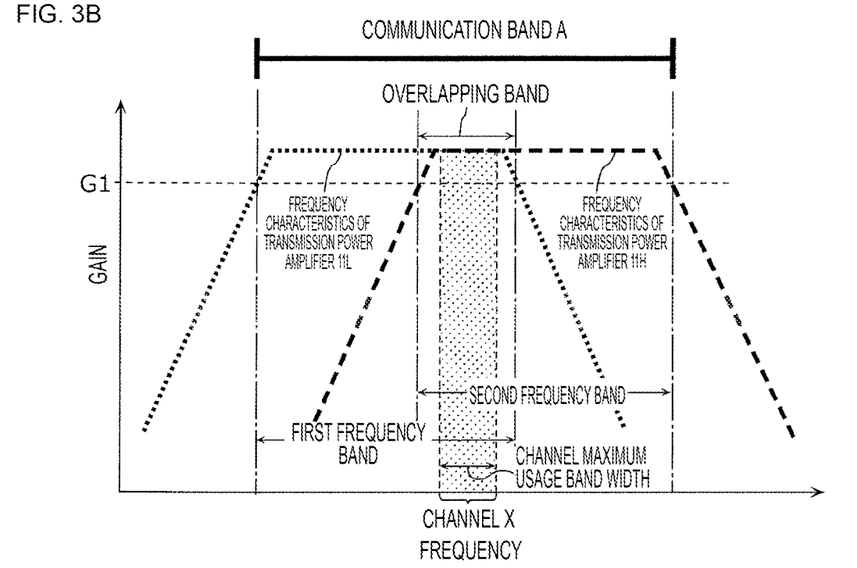
FIG. 3B is a diagram illustrating a relationship in which the overlapping band of the frequency characteristics of the gain is equal to or greater than the maximum usage band width of the channel.

FIG. 3B is a diagram illustrating a relationship in which the overlapping band of the frequency characteristics of the gain is equal to or larger than the maximum usage band width of the channel.

In the figure, in the transmission power amplifier 11L, the first frequency band in which the gain is equal to or more than G1 is positioned on the low frequency side of the communication band A, and in the transmission power amplifier 11H, the second frequency band in which the gain is equal to or more than G1 is positioned on the high frequency side of the communication band A. Here, the band width (overlapping band width) of the band in which the first frequency band and the second frequency band overlap each other is equal to or larger than the maximum usage band width of the channel. In this case, as illustrated in FIG. 3B, the channel x of the communication band A is included in the overlapping band width. Then, when the transmission is performed using the channel x, it is possible to ensure good amplification characteristics equal to or more than the gain G1 even when either of the transmission power amplifier 11L or the transmission power amplifier 11H is selected.

From the above-described viewpoint, in the high frequency amplifier circuit 1A according to the present modification, it is desirable that the overlapping band width between the first frequency band and the second frequency band be equal to or larger than the maximum usage band width of the channel. Accordingly, it is possible to ensure good amplification characteristics equal to or more than the gain G1 even when either of the transmission power amplifier 11L or the transmission power amplifier 11H is selected.

In addition, in consideration of the band width of the wide communication band A, the maximum usage band width of the channel, and the overlapping band width described above, each of the band width of the first frequency band to which the transmission power amplifier 11L corresponds and the band width of the second frequency band to which the transmission power amplifier 11H corresponds can be equal to or larger than about 400 MHz.

Accordingly, good amplification characteristics in the entire area of the wide communication band A can be ensured even in a case where the high frequency amplifier circuit 1A according to the present modification is applied to any one of n77 (frequency band width 900 MHz, channel maximum usage band width 100 MHz), n78 (frequency band width 500 MHz, channel maximum usage band width 100 MHz), and n79 (frequency band width 600 MHz, channel maximum usage band width 100 MHz), which are communication bands in the 5G (NR) of the 3GPP standard, for example.

1.3 Configuration of High Frequency Amplifier Circuit of Reception System

Figure 4:
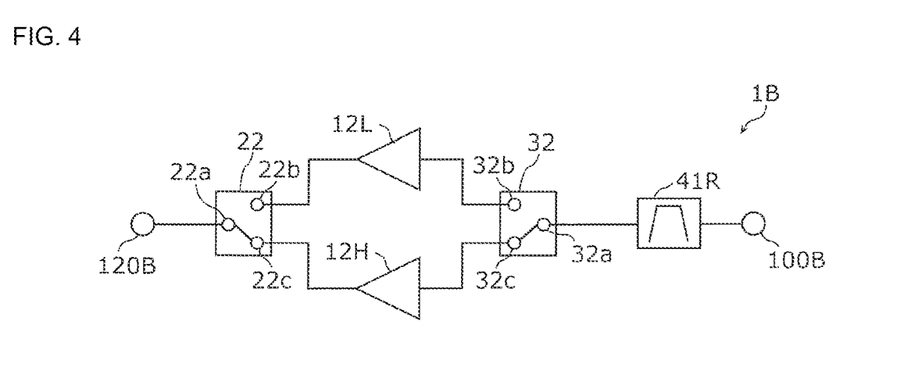
FIG. 4 is a circuit configuration diagram of a high frequency amplifier circuit according to Modification 2 of the embodiment.

FIG. 4 is a circuit configuration diagram of a high frequency amplifier circuit 1B according to Modification 2 of the embodiment. The high frequency amplifier circuit 1B illustrated in the figure includes an input terminal 100B, an output terminal 120B, reception low-noise amplifiers 12L and 12H, the switches 22 and 32, and the reception filter 41R. The high frequency amplifier circuit 1B according to the present modification differs from the high frequency amplifier circuit 1 according to the embodiment in that only a reception circuit is provided. Hereinafter, for the high frequency amplifier circuit 1B according to the present modification, a description on the same points as those of the high frequency amplifier circuit 1 according to the embodiment will be omitted, and a description will be focused on different points.

The reception low-noise amplifier 12L is the first amplifier disposed between the input terminal 100B and the output terminal 120B, and is a first reception low-noise amplifier that preferentially amplifies a high frequency signal in the third frequency band among the high frequency signals input from the input terminal 100B. More specifically, the reception low-noise amplifier 12L amplifies the high frequency signal in the third frequency band, which is a part of the single communication band A (first communication band), at equal to or higher than a prescribed amplification factor (or a prescribed gain). Note that, in the high frequency amplifier circuit 1B according to the present modification, such gain G2 of the reception low-noise amplifier in which the high frequency signal output from the output terminal 120B becomes equal to or higher than the predetermined power value is required. That is, in the frequency characteristics of the gain of the reception low-noise amplifier 12L, the gain is equal to or more than G2 in the third frequency band that is the low frequency side of the communication band A, but the gain is smaller than G2 in the band of the communication band A on the high frequency side than the third frequency band of the communication band A.

The reception low-noise amplifier 12H is the second amplifier disposed between the input terminal 100B and the output terminal 120B, and is a second reception low-noise amplifier that preferentially amplifies a high frequency signal in the fourth frequency band among the high frequency signals input from the input terminal 100B. More specifically, the reception low-noise amplifier 12H amplifies the high frequency signal in the fourth frequency band, which is a part of the single communication band A (first communication band), at equal to or higher than a prescribed amplification factor (or a prescribed gain). That is, in the frequency characteristics of the gain of the reception low-noise amplifier 12H, the gain is equal to or higher than G2 in the fourth frequency band that is the high frequency side of the communication band A, but the gain is smaller than G2 in the band on the low frequency side than the fourth frequency band in the communication band A.

The switch 22 is a third switch having a common terminal 22a (third common terminal) and selection terminals 22b (fifth selection terminal) and 22c (sixth selection terminal). The common terminal 22a is connected to the output terminal 120B, the selection terminal 22b is connected to an output end of the reception low-noise amplifier 12L, and the selection terminal 22c is connected to an output end of the reception low-noise amplifier 12H.

The switch 32 is a fourth switch having a common terminal 32a (fourth common terminal) and selection terminals 32b (seventh selection terminal) and 32c (eighth selection terminal). The common terminal 32a is connected to an output end of the reception filter 41R, the selection terminal 32b is connected to an input end of the reception low-noise amplifier 12L, and the selection terminal 32c is connected to an input end of the reception low-noise amplifier 12H.

In the above-described configuration, the switches 22 and 32 exclusively switch between connection between the input terminal 100B, the reception low-noise amplifier 12L, and the output terminal 120B, and connection between the input terminal 100B, the reception low-noise amplifier 12H, and the output terminal 120B.

Note that the switch circuit configured by the switches 22 and 32 and the control unit that controls a connection state of the switch circuit may be configured by one chip switch IC.

The reception filter 41R is a filter having an input end connected to the input terminal 100B, in which the entire area of the single communication band A is used as a pass band. The reception filter 41R is always connected to either of the reception low-noise amplifiers 12L or 12H regardless of the switching of the switches 22 and 32.

According to the high frequency module 1B according to the present modification, in each of the reception low-noise amplifiers 12L and 12H, the dynamic range having the above-described prescribed amplification factor (or the prescribed gain) is smaller than the frequency band of the communication band A. However, by exclusively switching between the two reception low-noise amplifiers 12L and 12H having different frequency characteristics of the gain by the switches 22 and 32, it is possible to ensure good amplification characteristics in the entire area of the wide communication band A.

OTHER EMBODIMENTS

The high frequency amplifier circuit and the communication device according to the present disclosure have been described above with reference to the embodiment and the modification examples, but the present disclosure is not limited to the above-described embodiment and modifications. Another embodiment realized by combining arbitrary constituent elements in the above-described embodiment and modifications, modifications obtained by applying various changes conceived by those skilled in the art without necessarily departing from the spirit of the present disclosure with respect to the above embodiment, and various devices incorporating the high frequency amplifier circuit and the communication device according to the present disclosure are also included in the present disclosure.

Further, for example, in the high frequency amplifier circuit and the communication device according to the embodiment and the modification, a matching element, such as an inductor, a capacitor and the like, and a switch circuit may be connected between the constituent elements. Note that the inductor may include a wiring inductor formed of a wiring connecting between the respective constituent elements.

INDUSTRIAL APPLICABILITY

The present disclosure can be widely used as a high frequency amplifier circuit and a communication device that can be applied to a communication system having a wide communication band which is equal to or higher than 3 GHz, and can be widely used in communication devices, such as mobile phones.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:
1. A high frequency amplifier circuit comprising:
an input terminal and an output terminal;

a first power amplifier between the input terminal and the output terminal, and configured to amplify a high frequency signal in a first frequency band being part of a communication band;

a second power amplifier between the input terminal and the output terminal, and configured to amplify a high frequency signal in a second frequency band being part of the communication band;

a first switch circuit comprising a first common terminal, a first selection terminal, and a second selection terminal, the first common terminal being connected to the input terminal, the first selection terminal being connected to an input end of the first power amplifier, and the second selection terminal being connected to an input end of the second power amplifier;

a second switch circuit comprising a second common terminal, a third selection terminal, and a fourth selection terminal, the third selection terminal being connected to an output end of the first power amplifier, and the fourth selection terminal being connected to an output end of the second power amplifier; and a filter comprising a filter input terminal and a filter output terminal, and the filter input terminal being connected to the second common terminal, and the filter output terminal being connected to the output terminal, wherein the communication band comprises a plurality of channels allocated as frequency bands usable in a single communication, the first frequency band is different than the second frequency band, the first frequency band and the second frequency band partially overlap each other, an overlapping bandwidth between the first frequency band and second frequency band is equal to or greater than a maximum usage bandwidth of one of the channels of the communication band.

2. The radio-frequency module according to claim 1, wherein the first communication band is fifth generation (5G) New Radio (NR) band n77, n78, or n79.

\* \* \* \* \*